(12) United States Patent
Krishna et al.

(10) Patent No.: US 7,659,536 B2
(45) Date of Patent: Feb. 9, 2010

(54) HIGH PERFORMANCE HYPERSPECTRAL DETECTORS USING PHOTON CONTROLLING CAVITIES

(75) Inventors: Sanjay Krishna, Albuquerque, NM (US); Oskar J. Painter, Sierra Madre, CA (US)

(73) Assignee: STC.UNM, Albuquerque, NM (US)

( * ) Notice: Subject to any disclaimer, the term of this patent is extended or adjusted under 35 U.S.C. 154(b) by 24 days.

(21) Appl. No.: 11/225,006

(22) Filed: Sep. 14, 2005

(65) Prior Publication Data
US 2006/0054880 A1 Mar. 16, 2006

Related U.S. Application Data

(60) Provisional application No. 60/609,902, filed on Sep. 14, 2004.

(51) Int. Cl.
*H01L 29/06* (2006.01)

(52) U.S. Cl. .................... 257/14; 257/21; 257/414; 257/E31.022; 257/E31.033; 257/E31.054

(58) Field of Classification Search .......... 257/E31.033, 257/14, 21, 414, E21.022
See application file for complete search history.

(56) References Cited

U.S. PATENT DOCUMENTS

| 4,503,447 | A | * | 3/1985 | Iafrate et al. ............... 257/15 |
| 5,332,681 | A | * | 7/1994 | Tonucci et al. ............. 438/493 |
| 5,539,206 | A | * | 7/1996 | Schimert .................. 250/338.4 |
| 6,239,449 | B1 | | 5/2001 | Fafard et al. |
| 6,355,939 | B1 | * | 3/2002 | Dodd ........................ 257/21 |
| 2001/0012149 | A1 | * | 8/2001 | Lin et al. ................... 359/344 |
| 2002/0167984 | A1 | * | 11/2002 | Scherer ..................... 372/50 |
| 2004/0021138 | A1 | * | 2/2004 | Shields et al. .............. 257/17 |
| 2004/0124409 | A1 | * | 7/2004 | Ebe et al. .................. 257/14 |
| 2005/0212045 | A1 | * | 9/2005 | Tamai ....................... 257/347 |

OTHER PUBLICATIONS

Raghavan et al., "High-responsivity, normal-incidence long-wave infrared (lambda ~ 7.2 micrometers) InAs/In sub0.15 Ga sub0.85 As dots-in-well detector", Applied Physics Letters, vol. 81, No. 8, p. 1369, Aug. 2002.*
Eui-Tae et al., "Tailoring detection bands of InAs quantum-dot infrared photodetectors using In.subx.Ga.sub1-x.As strain-relieving quantum wells", Applied Physics Letters, vol. 79, No. 20, Nov. 2001.*
Moosburger et al., Nanofabrication of high quality photonic crystal for integrated optics circuits, Nanotechnology, vol. 13, 2002, pp. 341-345.*
Ariyawansa, IEEE Photonics Technology Letters, vol. 17, No. 5 (2005) pp. 1064-1066.

* cited by examiner

*Primary Examiner*—Eugene Lee
*Assistant Examiner*—Peniel M Gumedzoe
(74) *Attorney, Agent, or Firm*—MH2 Technology Law Group

(57) ABSTRACT

According to various embodiments, a photodetector including a first contact layer, a second contact layer, an active region, and a photonic crystal resonant cavity is disclosed. The photonic crystal resonant cavity can operate as a resonant structure to enhance the response of the photodetector at one or more wavelengths. In various embodiments, the photodetectors including a photonic crystal resonant cavity can, for example, demonstrate increased responsivity and quantum efficiency, lower the operating temperature, and/or be used to form a hyperspectral detector.

15 Claims, 5 Drawing Sheets

FIG. 7

HIGH PERFORMANCE HYPERSPECTRAL DETECTORS USING PHOTON CONTROLLING CAVITIES

CROSS-REFERENCE TO RELATED APPLICATIONS

This application claims priority to U.S. Provisional Patent Application Ser. No. 60/609,902 filed on Sep. 14, 2004, the disclosure of which is incorporated in its entirety by reference herein.

FIELD OF THE INVENTION

The present invention relates to phototectors and, more particularly, relates to photodetectors including a photonic crystal resonant cavity.

BACKGROUND OF THE INVENTION

Photodetectors convert electromagnetic radiation, such as visible and infrared light, into an electronic signal that is proportional to the incident electromagnetic radiation. Photodetectors based on interband transitions in bulk materials or quantum wells generally operate in the visible and near infrared wavelengths. Photodetectors based on intersubband transitions in superlattices, quantum wells, or quantum dots generally operate in the infrared wavelengths.

A quantum well infrared photodetector (QWIP) is a device that produces intersubband transitions within a conduction band (or valence band) of a semiconductor material when a ground state electron moves to an excited state upon absorbing an incident photon having energy equal to the subband spacing. In the excited state, the electron can move freely within the QWIP to cause an electrical current under bias. Conventional QWIPs generally consist of multiple layers of compound semiconductor materials, for example, alternating layers of InGaAs and AlGaAs, between two contact layers.

A conventional quantum dot infrared photodetector (QDIP) generally consists of one or more layers of quantum dots between two contact layers. The quantum dots have a size approximately equal to the wavelength of an electron in the crystal structure and act as a localized attractive potential (potential hole). Because the electrons are confined to the hole, they have discrete energy levels similar to the energy levels of an atom. Thus, the quantum dots can be made to be sensitive to particular wavelengths of light by controlling the size and potential of the quantum dots. If an incident photon has a wavelength corresponding to the separation of the ground and the excited state, it can be absorbed. An electric field can be applied to the quantum dots to remove the excited electrons. The change in electric current, which is proportional to the intensity of light, can then be measured.

Conventional photodiodes, however, suffer from low responsivity and low quantum efficiency. Additional problems arise due to the low operating temperatures of these devices.

Thus, there is a need to overcome these and other problems of the prior art to provide devices and methods for detecting electromagnetic radiation that have increased quantum efficiency and higher operating temperatures.

SUMMARY OF THE INVENTION

According to various embodiments, the present teachings include a photodetector including a first contact layer, a second contact layer, and an active region disposed between the first and second contact layers. The photodetector can further include a photonic crystal resonant cavity disposed between the first and second contact layers.

According to various other embodiments, the present teachings include a semiconductor device including one or more first contacts and one or more second contacts. The semiconductor device can also include a plurality of active regions, wherein each of the plurality of active regions is in electrical contact with the one or more first contacts and the one or more second contacts. The semiconductor device can further include a photonic crystal resonant cavity disposed in each of the plurality of active regions.

According to still other embodiments, the present teachings include a quantum dot infrared photodetector including a first doped GaAs layer, a second doped GaAs layer, and an InAs/InGaAs/GaAs quantum dots-in-a-well structure active region. The quantum dot infrared detector can further include a photonic crystal resonant cavity disposed in a portion of the active region, wherein the photonic crystal resonant cavity comprises a plurality of localized defects arranged in a desired pattern.

According to still further embodiments, the present teachings include a method of detecting light. The method can include biasing a semiconductor device and receiving light into the semiconductor device. A first photonic resonant cavity can be used to increase absorption within a first spectral bandwidth. An electric signal proportional to the intensity of the passed light can then be output.

According to various embodiments, the present teachings include a method for making a photodetector. The method can include forming a first contact layer and forming an active region over the first contact layer. A photonic crystal resonant cavity can be formed in the active region by introducing a desired pattern of localized defects. A second contact layer can then be formed over the active region.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

In the following description, reference is made to the accompanying drawings that form a part thereof, and in which are shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, not to be taken in a limited sense.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

FIGS. 1-7 depict exemplary embodiments of devices that include a photonic crystal resonant cavity. As used herein, the term "photonic crystal resonant cavity," "photon controlling cavity," and "photonic crystal" are used interchangeably and refer to a structure comprising a periodically varying index of refraction between, for example, a high index value and a low index value, and formed by one or more defects, such as, for example, cavities. The photonic crystal resonant cavity can operate as a resonant structure to enhance the response of a device at one or more wavelengths. The devices can include but are not limited to sensors, focal plane arrays, lasers, solar cells, diodes, and thermo-photovoltaic devices. In various embodiments, the photodetectors including a photonic crystal resonant cavity can, for example, demonstrate increased responsivity and quantum efficiency, lower the operating temperature, and/or be used to form a hyperspectral detector.

Figure 1:
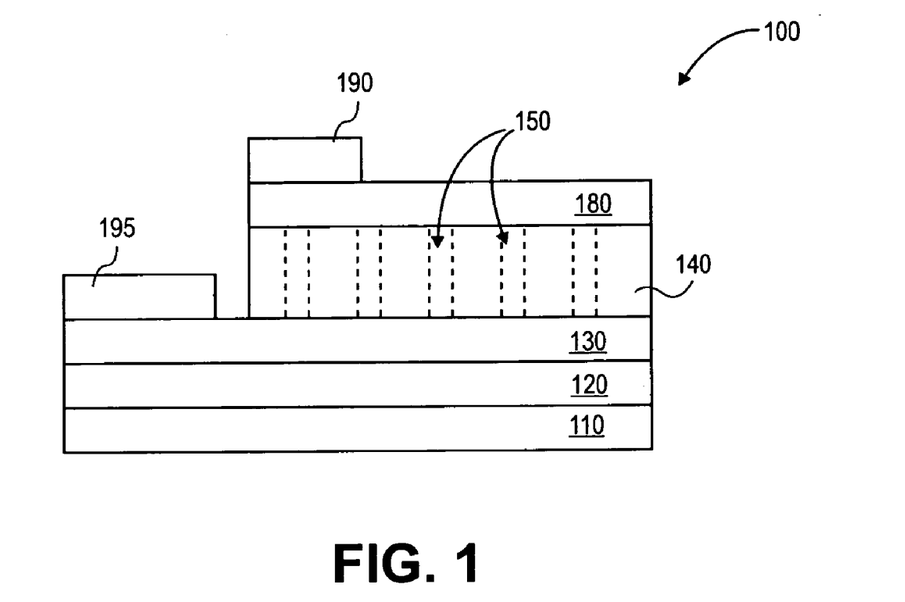
FIG. 1 depicts an exemplary photodetector including a photonic crystal resonant cavity in accordance with the present teachings.

FIG. 1 depicts an exemplary device using a photonic crystal resonant cavity. An exemplary photodetector 100 can include a first contact layer 130, a second contact layer 180, and an active region 140 disposed between first contact layer 130 and second contact layer 180. Photodetector 100 can further include a photonic crystal resonant cavity 150. The photonic crystals resonant cavities disclosed herein are each formed by a plurality of cavities in the active area, for example, as depicted in FIGS. 1-6. However, for ease of illustration, only a portion of the cavities will be identified in the figures with a reference number. One of skill in the art will understand that the photonic crystals resonant cavities are formed by a plurality of cavities arranged in a desired pattern.

Photodetector 100 can also include a substrate layer 110, a buffer layer 120 formed on substrate 110, a first contact 190, and a second contact 195. In various embodiments, substrate layer 110 can provide a surface to build the device on and also can provide structural integrity to the completed device.

Substrate 110 and buffer layers 120 and 180 can be conductive or insulating depending on the desired optical and electrical properties. Substrate layer 110 can be formed of materials known to one of ordinary skill in the art, such as, for example, materials including gallium, indium, aluminum, silicon, silicon oxide, sapphire, gallium arsenide, diamond, silicon carbide, arsenic, and phosphorus. Buffer layer 120 can also be formed of materials known to one of ordinary skill in the art. In various embodiments, buffer layer 120 can initiate proper growth conditions, establish the desired conductivity between substrate 110 and contact 130, and/or serve as an etch stop layer.

First contact 190 and second contact 195 can be used to apply a bias voltage to photodector 100. They can be formed of metal or other conductive materials known to one of ordinary skill in the art. First contact layer 130 and second contact layer 180 can also be formed of materials known to one of ordinary skill in the art, such as, for example, n-doped GaAs and doped as desired, or indium-tin-oxide. In various embodiments, contact layer 130 and 180 can act as a collector and/or emitter for the device.

In an exemplary embodiment, active region 140 can be a quantum dot structure. Referring to the partial view of infrared detector 100 shown in FIG. 2, the quantum dot structure forming active region 140 can include quantum dot layers 142 and 144 separated by barrier layers 141, 143, and 145. Non-limiting examples of quantum dot layers 142 and 144 include InGaAs, AlInAs, InP, and other alloys of AlGaInAsP on GaAs, and InGaAs on InP. Barrier layers 141, 143, and 145 can be, for example, AlGaAs or AlGaInP doped to provide carriers for conductivity. Barrier layers 141, 143, and 145 can be continuously doped or modulation doped. Active region 140 including a quantum dot structure can be formed by methods known to one of ordinary skill in the art, examples of which are disclosed in U.S. Pat. No. 6,239,449, which is incorporate by reference in its entirety herein.

Figure 2:
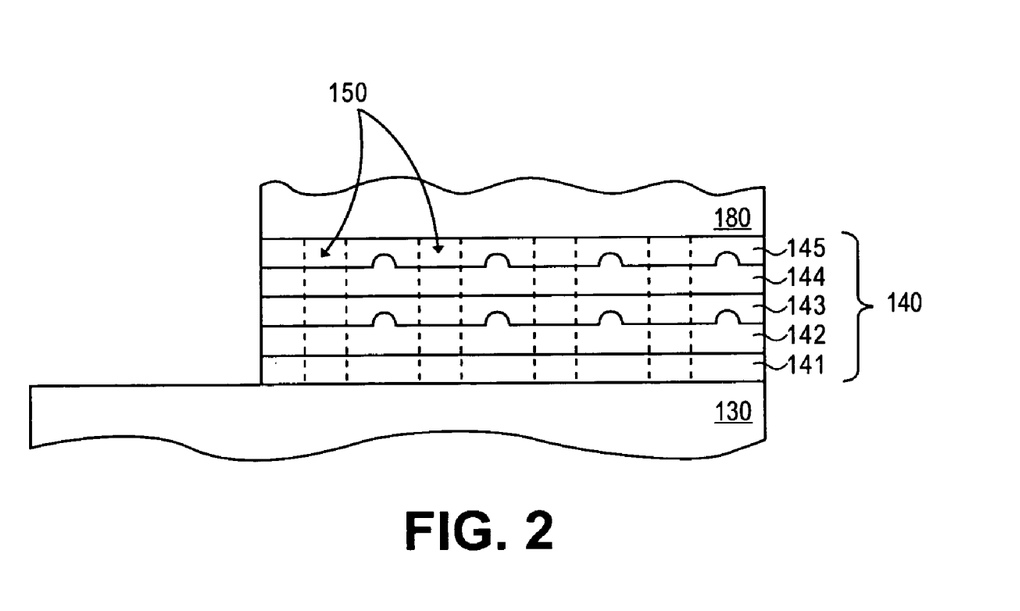
FIG. 2 depicts an exemplary photodetector including a photonic crystal resonant cavity in a quantum dot structure in accordance with the present teachings.

Photonic crystal 150 can be formed in active region 140 through the quantum dot structure as depicted in FIG. 2. Although active region 140 is depicted in FIG. 2 as including two quantum dot layers, one of ordinary skill in the art will understand that less than two or more than two quantum dot layers can be used. In embodiments with multiple quantum dot layers separated by barrier layers, the barrier layers and quantum dot layers can, respectively, have the same nominal composition and/or thickness. Alternatively, the alloy composition, doping and thickness can be tailored for a desired spectral response. Further, although photonic crystal resonant cavity 150 is depicted in FIG. 2 having four cavities for ease of illustration, one of ordinary skill in the art will understand that the number and arrangement of the cavities can vary as desired and that other arrays (patterns) and number of cavities can be used.

Photonic crystal resonant cavity 150 can be a structure having a periodically varying index of refraction between, for example, a high index value and a low index value, and formed by one or more defects. Photonic crystal resonant cavity 150 can be formed by, for example a plurality of localized defects in active region 140, such as, for example, a plurality of line defects. Each of the plurality of line defects will have a refractive index different than the refractive index of the material comprising active region 140. In various embodiments, the defects, such as line defects, can be cavities or holes formed by e-beam lithography. The cavities or holes can be filled with air, liquid, or other material with a different index of refraction from the active layer materials. The cavities or holes can also be formed by other methods known to one of ordinary skill in the art, such as, for example, lithography and etching.

Figure 3:
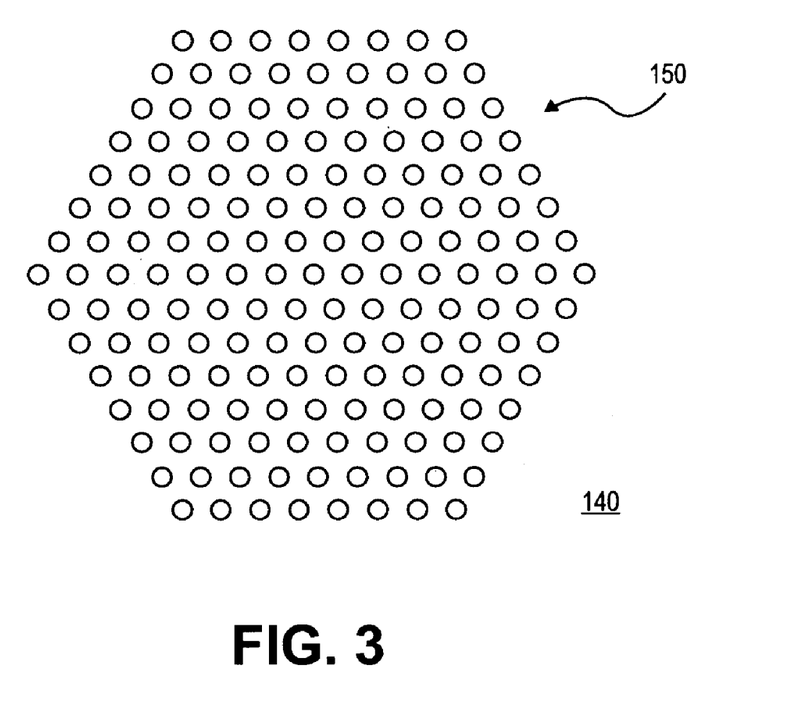
FIG. 3 depicts a top view of a hexagonal pattern of cavities within an active region forming a photonic crystal resonant cavity in accordance with the present teachings.

Because the dimensions of cavities forming photonic crystal resonant cavity 150 define the position of the spectral response peak and the Q (quality factor) of the cavity, the cavities can be sized and arranged in an array for a desired spectral bandwidth. In various embodiments, the ratio of the radii of the localized defects to the lattice constant can be between about 0.01 to about 0.5. In various other embodiments, the localized defects can be arranged in an array. FIG. 3 is a top view of active region 140 showing a hexagonal array of air holes forming photonic crystal resonant cavity 150.

In operation, contacts 190 and 195 can be biased. Incident light received by photodectector 100 can then affect the current between contacts 190 and 195. Characteristics of the incident light can then be determined from the measured change in current. Photodectector 100 can also be biased in such a way that a change in voltage can provide similar information. Each hole of photonic crystal resonant cavity 150 can serve as a small modal area waveguide tailored to have a small group dispersion. As such, the holes can function as a resonant cavity for light having a wavelength similar to the periodicity of the holes and can narrow and amplify the response.

Figure 4:
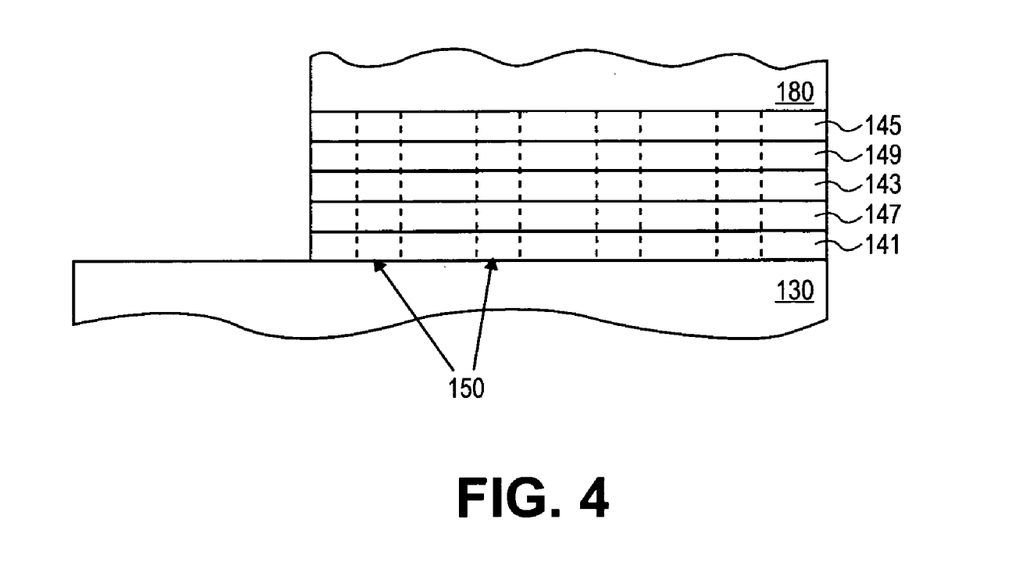
FIG. 4 depicts an exemplary photodetector including a photonic crystal resonant cavity in a quantum well structure in accordance with the present teachings.

According to various other embodiments, active region 140 can be a quantum well structure. Referring to FIG. 4, a quantum well structure 140 can include active layers 147 and 149, and barrier layers 141, 143, and 145. Active layers 147 and 149 can be formed of materials known to one of ordinary skill in the art including GaAs. Barrier layers 141, 143, and 145 can also be formed of materials known to one of ordinary skill in the art and can include aluminum, gallium, and arsenide alloys. Although two active layers stacked with three barrier layers is depicted in FIG. 4, additional active layers bounded by additional barrier layers is contemplated. Active region 140 including a quantum well structure can be formed by methods known to one of ordinary skill in the art.

Photonic crystal resonant cavity 150 can be formed in the layers of active region 140 by, for example, electron beam lithography. Although photonic crystal resonant cavity 150 is depicted in FIG. 4 having four cavities for ease of illustration, one of ordinary skill in the art will understand that the number and arrangement of the cavities is exemplary and that other arrays and number of cavities can be used.

In various other embodiments, active region 140 can be a dots-in-well (DWELL) structure. DWELL structures and methods for forming DWELL structures are describe in an article entitled "Effect of Well Width on Three-Color Quantum Dots-in-a Well Infrared Detectors," IEEE Photonics Technology Letters, vol. 17, no. 5, May 2005, which is incorporated by reference in its entirety herein. In an exemplary embodiment shown in FIG. 5, a photodetector 500 can include a first contact layer 530, a second contact layer 580, an active region 540, and a photonic crystal resonant cavity 550 within active region 540. Photodetector 500 can further include substrate 510, and contacts 590, 591, 595, and 596.

Figure 5:
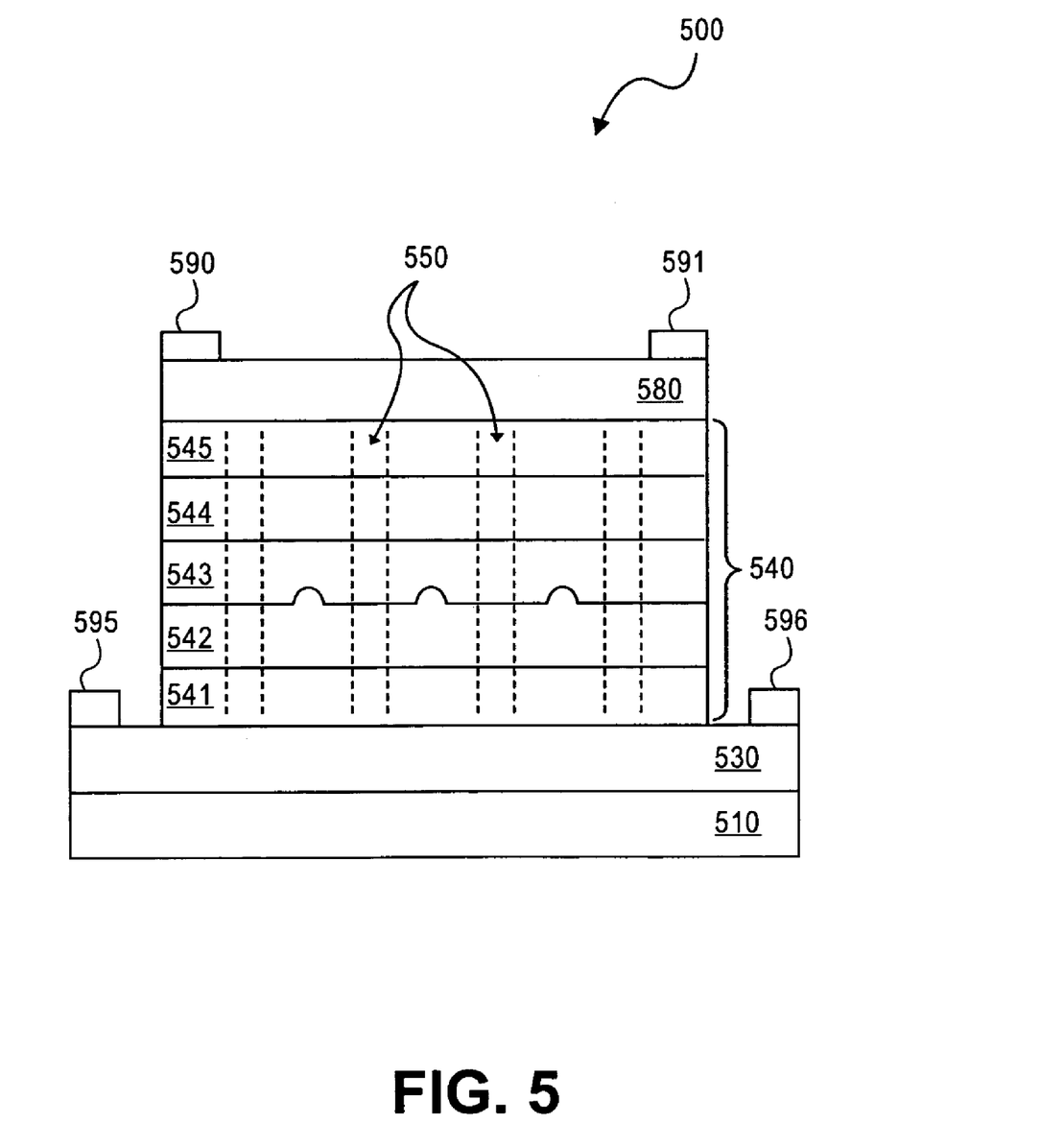
FIG. 5 depicts an exemplary photodetector including a photonic crystal resonant cavity in a DWELL structure in accordance with the present teachings.

In an exemplary embodiment of a DWELL structure, contact layers 530 and 580 can be n-doped GaAs layers. Active region 540 can include barrier layers 541 and 545 formed of GaAs. Active region 540 can further include a quantum dot layer 543 embedded in quantum well layers 542 and 544. In an exemplary embodiment, quantum dot layer 543 and quantum well layers 542 can be doped InAs quantum dots in InGaAs alloy quantum wells. In various other embodiments, additional stacks of quantum dot layers embedded between quantum well layers can be included between barrier layers 541 and 545.

Active region 540 can further include a photonic crystal resonant cavity 550 formed by a plurality of cavities. The cavities can be formed in active region 540 by, for example, e-beam lithography. The cavities can further form a pattern, for example, as shown in FIG. 3. In an exemplary embodiment, the cavities can have a radius r, a spacing a=2.74 µm, and a ratio r/a=0.32.

Figure 6:
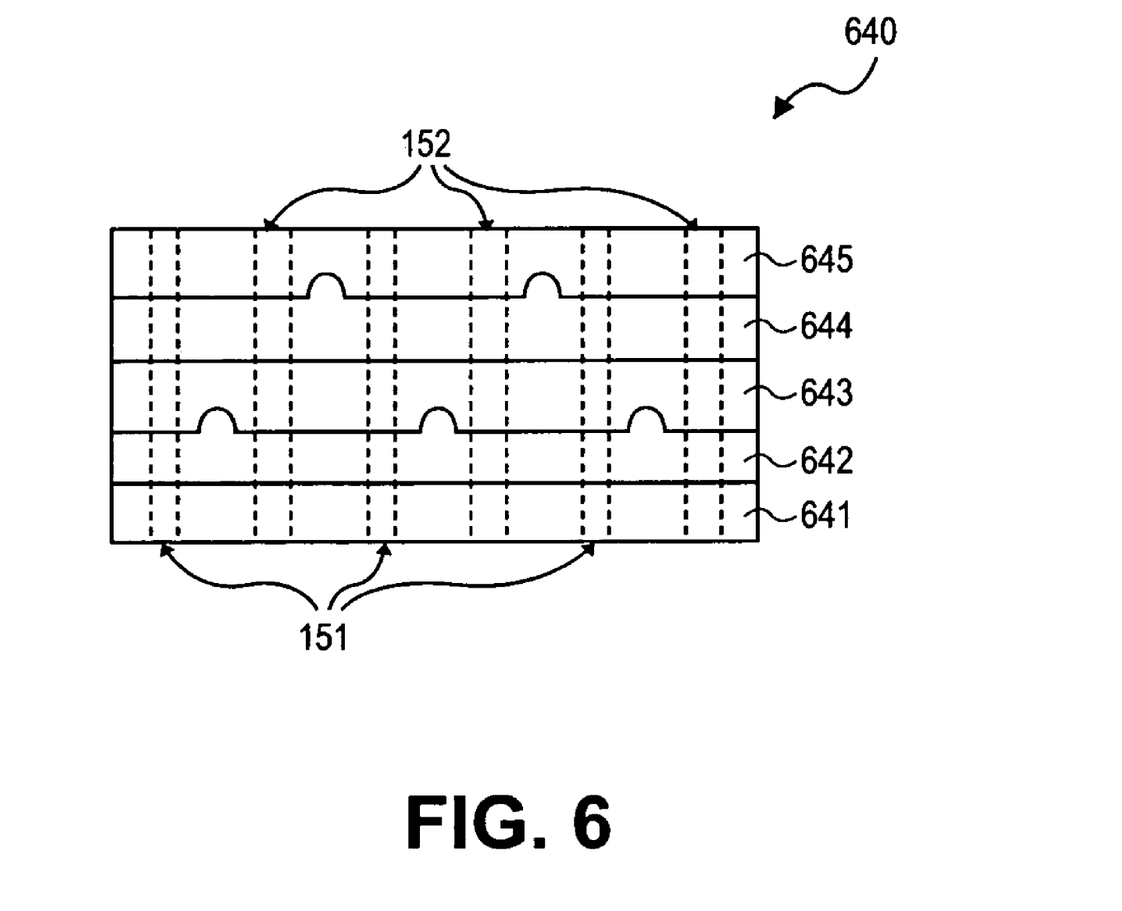
FIG. 6 depicts an exemplary photodetector including a photonic crystal resonant cavity in a quantum dot structure in accordance with the present teachings.

In various other embodiments, a hyperspectral detector, including a photonic crystal resonant cavity tuned to two or more particular spectral bandwidths can be formed. For example, referring to FIG. 6 active region 640 can include two or more quantum dot layers 642, 644 bound by barrier layers 641, 643, 645. Each quantum dot layer 642 and 644 can include quantum dots with different compositions, sizes, and spacing to optimize detection of particular wavelengths. A photonic crystal resonant cavity 150 can then be formed in active region 640 to optimize resonance at the particular wavelengths by changing the number, arrangement and/or size of the cavities. For example, as shown in FIG. 6, holes 151 can be sized differently than holes 152.

Figure 7:
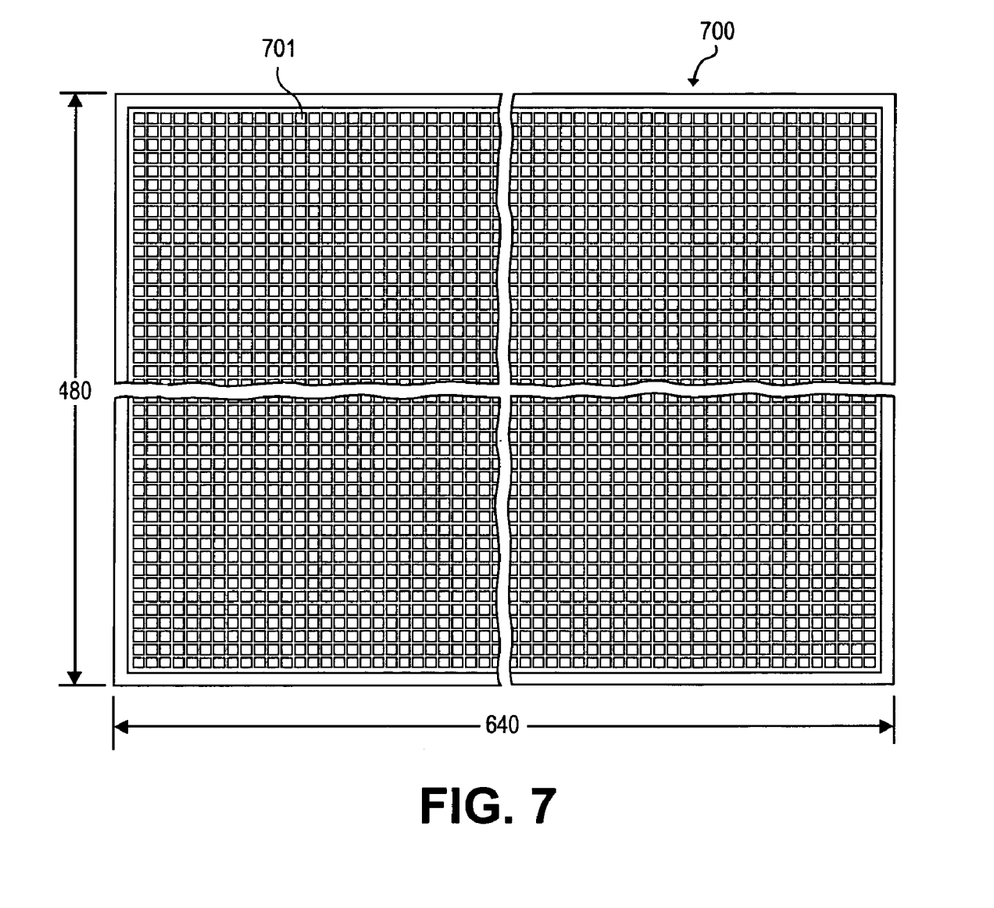
FIG. 7 depicts an exemplary focal plane array in accordance with the present teachings.

In various other embodiments, a focal plane array can be formed by a plurality of photodetectors. Each of the plurality of photodetectors can include a photonic crystal resonant cavity, as shown, for example, in FIGS. 1-6. In various embodiments, each of the plurality of photodetector can detect multiple wavelengths of light. As known to one of ordinary skill in the art, the plurality of photodetectors can be arranged to form a pixel. Referring to FIG. 7, a focal plane array 700 can then be formed by a plurality of pixels 701. In an exemplary embodiment, a 640 by 480 array of pixels can form focal plane array 700. One of ordinary skill in the art will understand that the number of photodetectors in each pixel and the number of pixels is exemplary, and that other embodiments are contemplated.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

As used herein, the term "one or more of" with respect to a listing of items such as, for example, A and B, means A alone, B alone, or A and B.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A photodetector comprising:
a first contact layer;
a second contact layer;
an active region comprising a quantum dot structure and disposed between and is in electrical contact with the first and second contact layers, wherein the quantum dot structure comprises alternating layers of a quantum dot layer and a barrier layer, the quantum dot layer comprising one of GaAs, InAs, InGaAs, AiInAs, InP, and other alloys of AIGaInAsP, and the barrier layer comprising one of AIGaAs and AIGaInP doped to provide carriers for conductivity; and
a photonic crystal resonant cavity disposed between the first and second contact layers, wherein the photonic crystal resonant cavity extends from the first contact layer to the second contact layer through the alternating layers of the quantum dot structure.

2. The photodetector of claim 1, wherein the photonic crystal resonant cavity comprises of a plurality of localized defects disposed in a portion of the active region and arranged in an array.

3. The photodetector of claim 2, wherein the plurality of localized defects have a refractive index different than a refractive index of the portion of the active region.

4. The photodetector of claim 2, wherein the array is a hexagonal pattern.

5. The photodetector of claim 4, wherein each of the plurality of localized defects comprises a cavity.

6. The photodetector of claim 2, wherein a ratio of a radii of the localized defects to a lattice constant is between about 0.01 and about 0.5.

7. The photodetector of claim 1, wherein the active region comprises a quantum well or superlattice structure.

8. The photodetector of claim 7, wherein the quantum well structure comprises alternating compound semiconductor layers comprising one of AlGaAs, InGaAlAs, InGaAlAsP, and GaAs.

9. The photodetector of claim 1, wherein the quantum dot structure comprises a dots-in-a-well (DWELL) configuration.

10. A photodetector device comprising:
   one or more first contacts
   one or more second contacts;
   a plurality of active regions, wherein each of the plurality of active regions comprises a quantum dot structure and is in electrical contact with the one or more first contacts and the one or more second contacts, wherein the quantum dot structure comprises alternating layers of a quantum dot layer and a barrier layer, the quantum dot layer comprising one of GaAs, InAs, InGaAs, AiInAs, InP, and other alloys of AlGaInAsP, and the barrier layer comprising one of AlGaAs and AlGaInP doped to provide carriers for conductivity; and
   a photonic crystal resonant cavity disposed in each of the plurality of active regions, wherein the photonic crystal resonant cavity extends from at least one of the first contacts to at least one of the second contacts through the alternating layers of the quantum dot structure.

11. The photodetector device of claim 10, wherein each of the plurality of photonic crystal resonant cavities is tuned to one of a plurality of desired spectral bandwidths.

12. The photodetector device of claim 10, wherein each of the photonic crystal resonant cavities comprises a plurality of localized defects within a portion of the active region, and wherein the localized defects are dimensioned to tune the photonic resonant cavity to one of the plurality of spectral bandwidths.

13. The photodetector device of claim 11, wherein the photodetector device is one of a focal plane array, a solar cell, and a diode.

14. A quantum dot infrared photodetector comprising:
   a first doped GaAs layer;
   a second doped GaAs layer;
   a first InAs/InGaAs/GaAs quantum dots-in-a-well structure active region disposed between and is in electrical contact with the first and second doped GaAs layers, wherein the active region includes at least one quantum dot layer, at least one quantum well layer, and at least one barrier layer; and
   a photonic crystal resonant cavity disposed in a portion of the active region, wherein the photonic crystal resonant cavity comprises a plurality of localized defects arranged in a desired pattern, the localized defects each extending from the first doped GaAs layer to the second doped GaAs layer through the quantum dot layer, the quantum well layer, and the barrier layer.

15. A hyperspectral focal plane array comprising:
   the quantum dot infrared photodetector of claim 14; and
   one or more additional InAs/InGaAs/GaAs quantum dots-in-a-well structures disposed in an array, wherein each of the one or more additional InAs/InGaAs/GaAs quantum dots-in-a-well structures comprises a photonic crystal resonant cavity, and wherein the localized defects are arranged and sized in each of the photonic crystal resonant cavities to form a tuned multi-band detector.

* * * * *

UNITED STATES PATENT AND TRADEMARK OFFICE
CERTIFICATE OF CORRECTION

| | | |
|---|---|---|
| PATENT NO. | : 7,659,536 B2 | |
| APPLICATION NO. | : 11/225006 | |
| DATED | : February 9, 2010 | |
| INVENTOR(S) | : Sanjay Krishna and Oskar J. Painter | |

It is certified that error appears in the above-identified patent and that said Letters Patent is hereby corrected as shown below:

Col. 1 lines 7-8 after the "CROSS-REFERENCE TO RELATED APPLICATIONS" section paragraph, please insert the following subheading and paragraph:

-- FEDERALLY SPONSORED RESEARCH

The present invention was made with government support under Grant No. FA9550-06-1-0443 awarded the Air Force Office of Scientific Research (AFOSR). As a result, the government has certain rights in this invention. --

Signed and Sealed this
Twelfth Day of March, 2013

Teresa Stanek Rea
*Acting Director of the United States Patent and Trademark Office*